United States Patent
Matsumoto et al.

(10) Patent No.: US 6,373,736 B2
(45) Date of Patent: Apr. 16, 2002

(54) ISOLATED CONVERTER

(75) Inventors: Yoshihiro Matsumoto, Sagamihara; Tadahiko Matsumoto, Yokohama, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/880,606

(22) Filed: Jun. 13, 2001

(30) Foreign Application Priority Data

Jun. 30, 2000 (JP) ........................................ 2000-198992

(51) Int. Cl.[7] ................................................ H02M 1/00
(52) U.S. Cl. ...................................................... 363/147
(58) Field of Search ........................... 363/147; 361/793

(56) References Cited

U.S. PATENT DOCUMENTS 4,670,833 A * 6/1987 Sachs ........................ 363/132
4,873,757 A * 10/1989 Williams .................... 363/147

\* cited by examiner

*Primary Examiner*—Shawn Riley
(74) *Attorney, Agent, or Firm*—Ostrolenk, Faber, Gerb & Soffen, LLP

(57) ABSTRACT

An isolated converter with a reduced size is disclosed. A small-sized multilayer sheet transformer includes a multilayer circuit board composed of a plurality of sheet substrates, coil patterns of primary and secondary coils disposed coaxially on the sheet substrates, and a core member disposed in a coil pattern unit formed of the coil patterns. In this multilayer sheet transformer, a coil pattern formed on the outer surface of the top layer and a coil pattern formed on the outer surface of the bottom layer are for the same coil on either the primary or secondary side. In the case where the coil patterns formed on the outer surfaces of the top and bottom layers of the multilayer sheet transformer are for the primary coil, an isolation gap is formed between the multilayer sheet transformer and a circuit on the secondary side to prevent an electrical breakdown between the primary and secondary sides. In the case where the coil patterns formed on the outer surfaces of the top and bottom layers of the multilayer sheet transformer are for the secondary coil, an isolation gap is formed between the multilayer sheet transformer and a circuit on the primary side to prevent an electrical breakdown between the primary and secondary sides.

4 Claims, 6 Drawing Sheets

ISOLATED CONVERTER

BACKGROUND OF THE INVENTION

1. Field of the Invention

The present invention relates to an isolated converter for use in a switching power supply or the like.

2. Description of the Related Art

An isolated converter (such as a DC-DC converter and isolated AC-DC converter) used in a switching power supply or the like is formed of a transformer, a primary-side circuit connected to a primary coil of the transformer, and a secondary-side circuit connected to a secondary coil of the transformer such that power supplied to the primary-side circuit is transformed in terms of voltage by the transformer and a resultant voltage is output from the secondary-side circuit.

In some cases, when the isolated converter is used in a device which needs to be small in size, a multilayer sheet transformer is employed as the transformer as will be described below. FIG. 4 illustrates, in the form of an exploded view, a multilayer sheet transformer. FIG. 5 is a cross-sectional view of the multilayer sheet transformer taken along line A—A of FIG. 4, and FIG. 6 is a cross-sectional view of the multilayer sheet transformer taken along line B—B of FIG. 4.

As shown in FIG. 4, the multilayer sheet transformer 1 is formed integrally with a multilayer circuit board 4 on which a primary-side circuit 2 and a secondary-side circuit 3 are formed. The multilayer sheet transformer 1 includes coil patterns 6 (6a, 6b) formed on a plurality of sheet substrates shown in FIG. 6 (three sheet substrates 5a, 5b, and 5c in the example shown in FIG. 6) forming the multilayer circuit board 4, a core member 11 (11a, 11b) which is E-shaped in cross section as shown in FIG. 4, and a core combining member 13.

In the conventional technique, to achieve good electrical and magnetic characteristics such as conversion efficiency or the degree of coupling between the primary coil and the secondary coil of the transformer, coil patterns 6a of the primary coil and coil patterns 6b of the secondary coil are alternately placed in successive layers in the multilayer structure (hereinafter, such a multilayer structure of coil patterns 6 will be referred to as a sandwich structure). More specifically, as shown in FIG. 6, one set of the primary or secondary coil patterns 6 (the primary coil pattern 6a in the specific example shown in FIG. 6) is formed on the upper surface of each of sheet substrates 5a, 5b, and 5c, and the other set of the primary or secondary coil patterns 6 (the secondary coil pattern 6b in the specific example shown in FIG. 6) is formed on the lower surface of each of sheet substrates 5a, 5b, and 5c.

These coil patterns 6 (6a, 6b) are coaxially disposed in the respective layers such that their central axes become coincident with each other so as to form a coil pattern unit 7. The plurality of primary coil patterns 6a formed on the respective sheet substrates 5a, 5b, and 5c are electrically connected to each other via connection conductors 15 (15a, 15b) extending via through-holes 14 (14a, 14b) so as to form the primary coil. Similarly, the plurality of primary coil patterns 6b are electrically connected to each other via connection conductors 17 (17a, 17b) extending via through-holes 16 (16a, 16b) so as to form the secondary coil.

In FIG. 6, reference numerals 8 denote insulating sheets (such as prepreg) disposed between sheet substrates to insulate the coil patterns 6a and 6b at vertically adjacent locations from each other.

As shown in FIG. 4, the multilayer circuit board 4 has core leg holes 10 formed at the center of the coil pattern unit 7 formed of the coil patterns 6a and 6b and at locations outside the coil pattern unit 7. Core legs 12 of the E-shaped core members 11a and 11b are inserted into the corresponding core leg holes 10 from the upper and lower sides of the multilayer circuit board 4 such that end faces of the respective core legs come into direct contact with each other as shown in FIG. 5. A pair of E-shaped core members 11a and 11b in contact with each other is fitted in a core combining member 13 having a shape shown in FIG. 4 such that the E-shaped core members 11a and 11b are combined together by the core combining member 13 and such that the coil pattern unit 7 is partially sandwiched by the respective E-shaped core members 11a and 11b inserted from the upper and lower sides of the multilayer circuit board 4, as shown in FIG. 5.

As described above, the multilayer sheet transformer 1 is formed integrally with the multilayer circuit board 4. Use of the multilayer sheet transformer 1 formed in such a manner allows a reduction in the thickness of the isolated converter.

In the conventional structure described above employing the multilayer sheet transformer 1, although it is easy to reduce the thickness of the isolated converter, it is difficult to reduce the size of the multilayer circuit board 4 and thus the total size of the isolated converter, for the reason described below.

That is, in the conventional structure, because the multilayer structure of the coil patterns 6 is obtained by means of disposing the coil patterns 6 into a sandwiched form as shown in FIG. 6, the coil pattern 6 (6a) formed on the outer surface of the top layer of the multilayer circuit board 4 is a coil pattern of the primary coil, while the coil pattern 6 (6b) formed on the outer surface of the bottom layer of the multilayer circuit board 4 is a coil pattern of the secondary coil. That is, the coil patterns formed on the outer surfaces of the top and bottom layers of the multilayer sheet transformer 1 are for different coils on either primary or secondary sides. Therefore, when a very large overvoltage appears in either the primary-side circuit 2 or the secondary-side circuit 3 for some reason, the overvoltage tends to create a spark, along the surface of the E-shaped core members 11a and 11b formed of ferrite or the like of the multilayer sheet transformer 1, between the primary-side circuit 2 and the secondary-side circuit 3, thereby causing an electrical breakdown between the primary and secondary circuits.

More specifically, a spark is easily created by an overvoltage between the primary-side circuit 2 and the surface of the E-shaped core member 11a close to the coil pattern 6a of the primary coil. Similarly, a spark is easily created by an overvoltage between the secondary-side circuit 3 and the surface of the E-shaped core member 11b close to the coil pattern 6b of the primary coil. If an overvoltage occurs, for example, in the primary-side circuit 2, the overvoltage first creates a spark between the primary-side circuit 2 and the surface of the E-shaped core member 11a disposed on the upper side. The overvoltage then propagates to the E-shaped core member 11b disposed on the lower side and creates a spark between the secondary-side circuit 3 and the surface of the E-shaped core member 11b located on the lower side. As a result, an electrical breakdown occurs between the primary and secondary circuits.

To ensure that no electrical breakdown occurs between the primary and secondary circuits, it is required that the multilayer sheet transformer 1 and the secondary-side circuit 3 be spaced from each other by a large enough distance to prevent an electrical breakdown between the primary and secondary sides. Because of the necessity of the large isolation space between the primary and secondary sides of the multilayer sheet transformer 1, it is difficult to reduce the size of the multilayer circuit board 4 and thus the total size of the isolated converter.

Further, as described earlier, because the coil patterns 6 have to be disposed so as to obtain the sandwich structure, the coil patterns 6a formed on the respective sheet substrates 5 have to be connected to each other by the connection conductors 15 (15a, 15b) via the through-holes 14 (14a, 14b) to obtain the primary coil, and the coil patterns 6b formed on the respective sheet substrates 5 have to be connected to each other by the connection conductors 17 (17a, 17b) via the through-holes 16 (16a, 16b) to obtain the secondary coil. Furthermore, it is necessary to form through-hole lands 20 on the upper and lower surfaces of the multilayer circuit board 4 so as to cover the openings of the through-holes 14 and 16.

The through-holes 14 and 16 and the connection conductors 15 and 17 for electrically connecting the coil patterns formed on the respective sheet substrates 5 and the through-hole lands 20 have to be formed such that they do not hinder the coil patterns 6a and 6b from being formed and such that good electrical isolation can be obtained. To meet the above requirements, the sheet substrates need to have a special space to dispose the through-holes 14 and 16, the connection conductors 15 and 17, and the through-hole lands 20. This also makes it difficult to reduce the size of the multilayer circuit board 4 and the total size of the isolated converter.

Another problem in the conventional structure described above is that the coil pattern 6a on the outer surface of the top layer and the coil pattern 6b on the outer surface of the bottom layer may e electrically connected to each other via the E-shaped core members 11a and 11b and thus the primary coil and the secondary coil may be electrically connected to each other.

In view of the above problems, it is an object of the present invention to provide an isolated converter which has excellent electrical isolation between primary and secondary sides and which can be easily formed so as to have a small size.

SUMMARY OF THE INVENTION

According to a first aspect of the present invention, to achieve the above and other objects, there is provided an isolated converter comprising a transformer of the type comprising a multilayer sheet transformer comprising a multilayer circuit board comprising a plurality of sheet substrates, a coil pattern forming a primary coil and a coil pattern forming a secondary coil disposed coaxially on the sheet substrates, and a core member disposed in a coil pattern unit formed of the coil patterns, the multilayer circuit board including a first area where a primary-side circuit on the side of the primary coil of the multilayer sheet transformer is formed, a second area where the multilayer sheet transformer is formed, and a third area where a secondary-side circuit on the side of the secondary coil of the multilayer sheet transformer is formed; the areas being located in order; a coil pattern formed on an outer surface of a top layer and a coil pattern formed on an outer surface of a bottom layer are for the same coil on either the primary or secondary side, wherein, in the case where the coil patterns formed on the outer surfaces of the top and bottom layers are for the primary coil, the multilayer sheet transformer is regarded as a part of the primary-side circuit and an insulation gap for achieving an electrical isolation between the primary and secondary sides is formed between the multilayer sheet transformer and the third area in which the secondary-side circuit is formed, while in the case where the coil patterns formed on the outer surfaces of the top and bottom layers are for the secondary coil, the multilayer sheet transformer is regarded as a part of the secondary-side circuit and an isolation gap for achieving an electrical isolation between the primary and secondary sides is formed between the multilayer sheet transformer and the first area in which the primary-side circuit is formed.

Preferably, in this isolated converter according to the present invention, coil patterns are formed on both surfaces of each sheet substrate such that a coil pattern formed on one surface of each sheet substrate and a coil pattern formed on the opposite surface of that sheet substrate are for the same coil on either the primary or secondary side, and wherein sheet substrates are disposed into a multilayer structure such that a primary-side sheet substrate on both surfaces of which coil patterns for the primary coil are formed and a secondary-side sheet substrate on both surfaces of which coil patterns for the secondary coil are alternately located.

In the multilayer sheet transformer constructed in the above-described manner according to the present invention, in the case where the coil patterns formed on the outer surfaces of the top and bottom layers are both for the primary coil, when an overvoltage appears in the circuit on the primary side, even if the overvoltage creates a spark between the circuit on the primary side and the core member of the multilayer sheet transformer, the overvoltage hardly creates a spark between the core member of the multilayer sheet transformer and the circuit on the secondary side, because the coil patterns formed on the outer surfaces of the top and bottom layers of the multilayer sheet transformer are not for the secondary coil but for the primary coil. Furthermore, because the multilayer sheet transformer and the circuit on the secondary side are spaced by the isolation gap, when an overvoltage appears in the circuit on the primary side, the overvoltage hardly causes a spark between the circuit on the secondary side and the circuit on the primary side via the surface of the core member. Thus, it is possible to prevent an electrical breakdown between the primary and secondary sides.

Conversely, when an overvoltage appears in the circuit on the secondary side, the overvoltage hardly creates a spark between the circuit on the secondary side and the core member of the multilayer sheet transformer, because the coil patterns formed on the outer surfaces of the top and bottom layers are both for the primary coil and because the multilayer sheet transformer and the circuit on the secondary side are spaced by the isolation gap. Also in this case, it is possible to prevent an electrical breakdown between the primary and secondary sides.

In the present invention, as described above, an electrical breakdown between the primary and secondary sides is prevented in a highly reliable fashion, and the isolation gap is needed only on one of the primary and secondary sides of the multilayer sheet transformer. Thus, in the present invention, in contrast to the conventional structure in which isolation gaps are needed on both primary and secondary sides of the multilayer sheet transformer, it is possible to reduce the size of the multilayer circuit board and thus the size of the isolated converter.

Other features and advantages of the present invention will become apparent from the following description of the invention which refers to the accompanying drawings.

BRIEF DESCRIPTION OF THE DRAWING(S)

DETAILED DESCRIPTION OF EMBODIMENTS OF THE INVENTION

Figure 1:
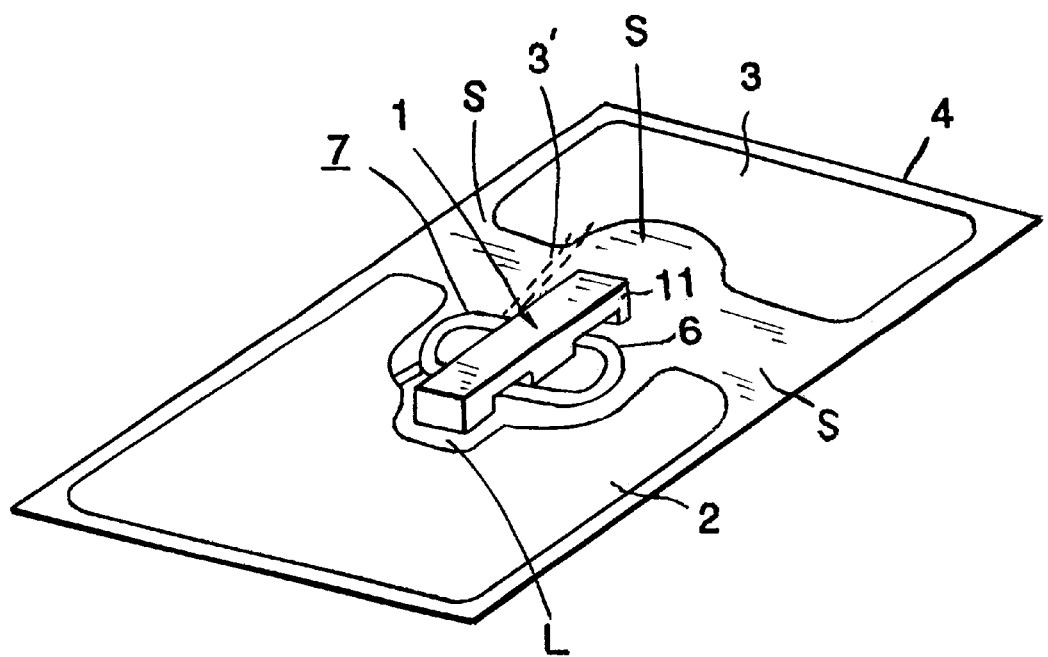
FIG. 1 is a schematic diagram illustrating an isolated converter including a primary circuit, multilayer sheet transformer, and a secondary circuit disposed in accordance with an embodiment of the present invention.

Embodiments of the present invention are described below with reference to the accompanying drawings. In the embodiments described below, parts similar to those of the conventional isolated converter described above are denoted by similar reference numerals, and they are not described in further detail herein.

The isolated converter disclosed herein according to an embodiment of the present invention includes, as with the conventional isolated converter described above, a multilayer sheet transformer 1, a primary-side circuit 2 connected to a primary coil of the multilayer sheet transformer 1, and a secondary-side circuit 3 connected to a secondary coil of the multilayer sheet transformer 1. However, the isolated converter according to the present embodiment is different from the conventional isolated converter in that it has a novel structure which allows a reduction in the size of the isolated converter and reduces the advance of electrical breakdown.

Figure 2:
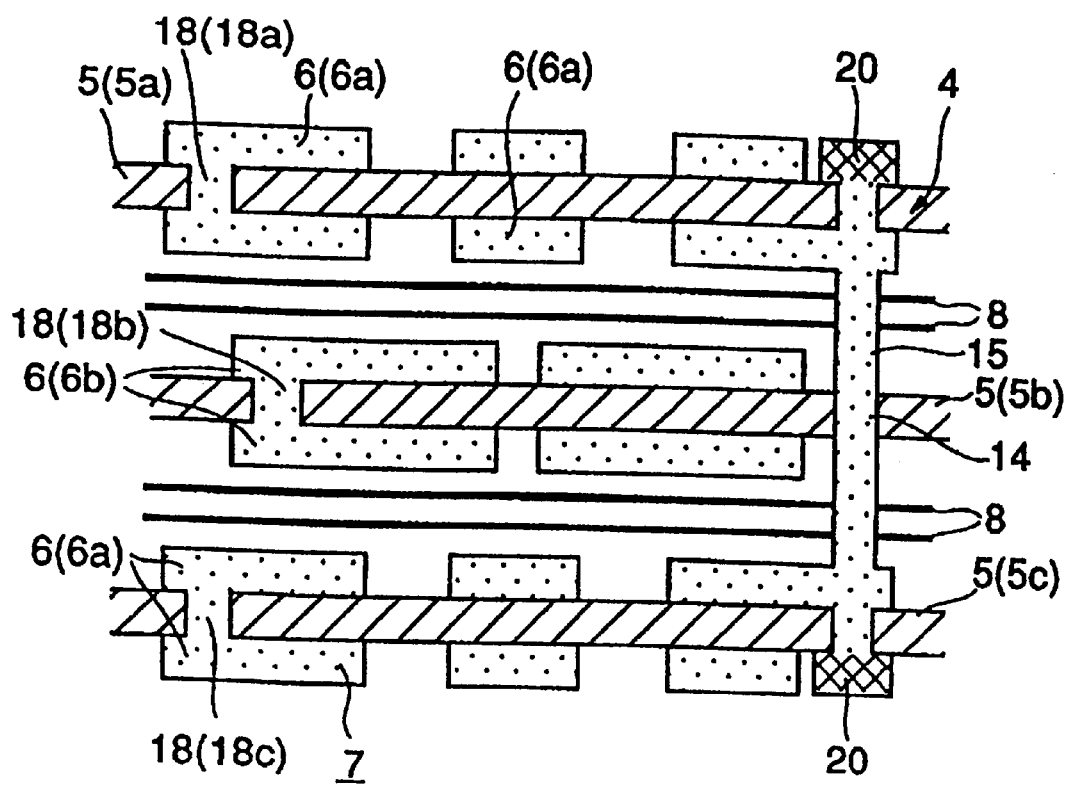
FIG. 2 is a schematic diagram illustrating coil patterns of the multilayer sheet transformer, formed in a multilayer structure according to the embodiment of the present invention.

That is, in the present embodiment, unlike the conventional isolated converter whose coil patterns are formed in the sandwich structure, coil patterns 6 of the multilayer sheet transformer 1 are formed in such a manner as shown in FIG. 2. That is, as shown in FIG. 2, coil patterns formed on sheet substrates 5a and 5c, which are two of a plurality of sheet substrates 5a, 5b, and 5c forming a multilayer circuit board 4 and which are located at the top and bottom of the multilayer circuit board 4, are all of a primary coil or are all of a secondary coil. On the upper and lower surface of the remaining sheet substrate 5b, coil patterns 6b for the other coil are formed. The sheet substrates 5a and 5c serve as primary-side sheet substrates on both sides of which the coil patterns 6a for the primary coil are formed, while the sheet substrate 5b serves as a secondary-side sheet substrates on both sides of which the coil patterns 6b for the secondary coil are formed.

As shown in FIG. 2, the sheet substrates 5a, 5b, and 5c are disposed to form a multilayer structure in which the primary-side sheet substrates and the secondary-side substrate are alternately located. In this multilayer structure, the coil patterns 6a formed on the outer surfaces of both the top and bottom layers of the multilayer sheet transformer 1 are for the same primary coil.

The coil patterns 6 formed on the upper and lower surface of each sheet substrate 5a, 5b, or 5c are electrically connected to each other via an inner via-hole (IVH) 18 (18a, 18b, or 18c). Therefore, in the case of the coil patterns 6b for the secondary coil, the coil patterns 6b formed on the upper and lower surfaces of the same sheet substrate 5b are electrically connected to each other via an IVH 18 (18b) so as to from the secondary coil. On the other hand, the coil patterns 6a formed on the upper and lower surfaces of each sheet substrate 5a and 5c are electrically connected to each other via an IVH 18 (18a or 18c), and furthermore the coil patterns 6a for the primary coil formed on different sheet substrates 5a and 5c are electrically connected to each other by a connection conductor 15 via a through-hole 14 so as to form the primary coil as shown in FIG. 2.

Thus, in the structure of the multilayer sheet transformer 1 according to the present embodiment, as described above, the coil patterns 6a formed on the upper and lower surfaces of the multilayer sheet transformer 1 are both for the primary coil.

In the case where the coil patterns 6a formed on the upper and lower surfaces of the multilayer sheet transformer 1 are both for the same primary coil, as is in the present embodiment, a pair of coil members 11a and 11b of the multilayer sheet transformer 1 is strongly affected by the circuit on the primary side. Therefore, the pair of coil members 11a and 11b of the multilayer sheet transformer 1 can be regarded as a part of the primary-side circuit 2.

In the present embodiment, for the above reason, the primary-side circuit 2 and the multilayer sheet transformer 1 are disposed at locations close to each other as shown in FIG. 1, while the secondary-side circuit 3 and the multilayer sheet transformer 1, especially the secondary-side circuit 3 and the core members 11 are spaced by an isolation gap S to achieve a good electrical isolation between the primary and secondary sides. It is to be noted that the primary-side circuit 2 and the secondary-side circuit 3 are also spaced by the isolation gap S. The specific distance of the isolation gap S depends of the required isolation performance. Generally, 1 kV/mm is regarded as one of standard characteristics.

On the other hand, since the multilayer sheet transformer 1 is regarded as a part of the primary-side circuit 2, it is not necessary to provide a large isolation gap therebetween. That is, the isolation gap L between the primary-side circuit 2 and the core members 11 can be set at a distance smaller than the isolation gap S between the core member 11 and the secondary-side circuit 3.

It is to be noted that the secondary coil pattern 6b (FIG. 2) is connected to the secondary-side circuit 3 through a conductive pattern 3' embedded in the multilayer circuit board 4 while the primary coil pattern 6a (FIG. 2) is connected to the primary-side circuit 2 through a conductive pattern 2' which is provided on the surface of the multilayer circuit board 4. Also, the primary-side circuit 2 and the secondary-side circuit 3 includes a conductive patterns provided on the surface of the multilayer circuit board 4 and various electronic components provided on the surface of the multilayer circuit board so as to connect the conductive patterns.

In the multilayer sheet transformer 1 according to the present embodiment, because the coil patterns 6 are disposed in the above-described manner into the multilayer structure and because the relative position between the multilayer sheet transformer 1 and the primary-side circuit 2 and that between the multilayer sheet transformer 1 and the secondary-side circuit 3 are determined in the above-described manner, when a very large overvoltage appears, for example, in the primary-side circuit 2, even if the overvoltage creates a spark between the primary-side circuit 2 and the surface of the core member 11 of the multilayer sheet transformer 1, the overvoltage hardly creates a spark between the core member 11 and the secondary-circuit 3 because the location of the core member 11 is close to the coil patterns 6a of the primary coil. Furthermore, because the multilayer sheet transformer 1 and the secondary-side circuit 3 are spaced by the isolation gap S as described above, the overvoltage hardly causes a spark between the secondary-side circuit 3 and the surface of the core member 11 of the multilayer sheet transformer 1. Thus, it is ensured that an overvoltage appearing in the primary-side circuit 2 hardly causes a spark between the primary-side circuit 2 and the secondary-side circuit 3 via the core member 11 of the multilayer sheet transformer 1 thereby preventing an electrical breakdown between the primary and secondary sides.

Conversely, when an overvoltage appears in the secondary-side circuit 3, the overvoltage hardly causes a spark between the secondary-side circuit 3 and the surface of the E-shaped core member 11 of the multilayer sheet transformer 1, because the coil patterns 6a formed on the upper and lower surfaces of the multilayer sheet transformer 1 are both for the primary coil and because the multilayer sheet transformer 1 and the secondary-side circuit 3 are spaced from each other by the isolation gap S. Thus an electrical breakdown between the primary and secondary sides is prevented.

Furthermore, in the multilayer sheet transformer 1 according to the present embodiment, because the coil patterns 6a formed on the outer surfaces of the sheet substrates at the top and bottom layers are for the same primary coil, and because the isolation gap S is formed only between the multilayer sheet transformer 1 and the area in which the secondary-side circuit 3 is formed and no isolation gap is formed between the multilayer sheet transformer 1 and the primary-side circuit 2, the size of the multilayer circuit board 4 becomes smaller than the size of the multilayer circuit board of the conventional multilayer sheet transformer in which isolation gaps are needed on both primary and secondary sides. Further, although the size of the multilayer circuit board 4 is reduced, substantially no electrical breakdown occurs between the primary and secondary sides. Thus, the present embodiment of the invention provides a very great advantage.

Furthermore, in the present embodiment, because the coil patterns 6 are disposed in the novel manner so as to form the multilayer structure, that is, because the coil patterns 6 are formed on the respective sheet substrates 5 such that the coil pattern on the upper surface of each sheet substrate is for the same coil on either the primary or secondary side as the coil pattern on the lower surface of that sheet substrate, and because the primary-side sheet substrates 5 on both surfaces of which the coil patterns 6a for the primary coil are formed and the secondary-side sheet substrate 5 on both surfaces of which the coil patterns 6b for the secondary coil are formed are alternately disposed in the multilayer structure, the numbers of connection conductors, through-holes, and through-hole lands for electrically connection between the coil patterns 6 formed on different sheet substrates 5 can be reduced compared with the numbers required in the conventional structure in which the coil patterns 6 are disposed in the sandwich fashion in the multilayer structure.

Figure 6:
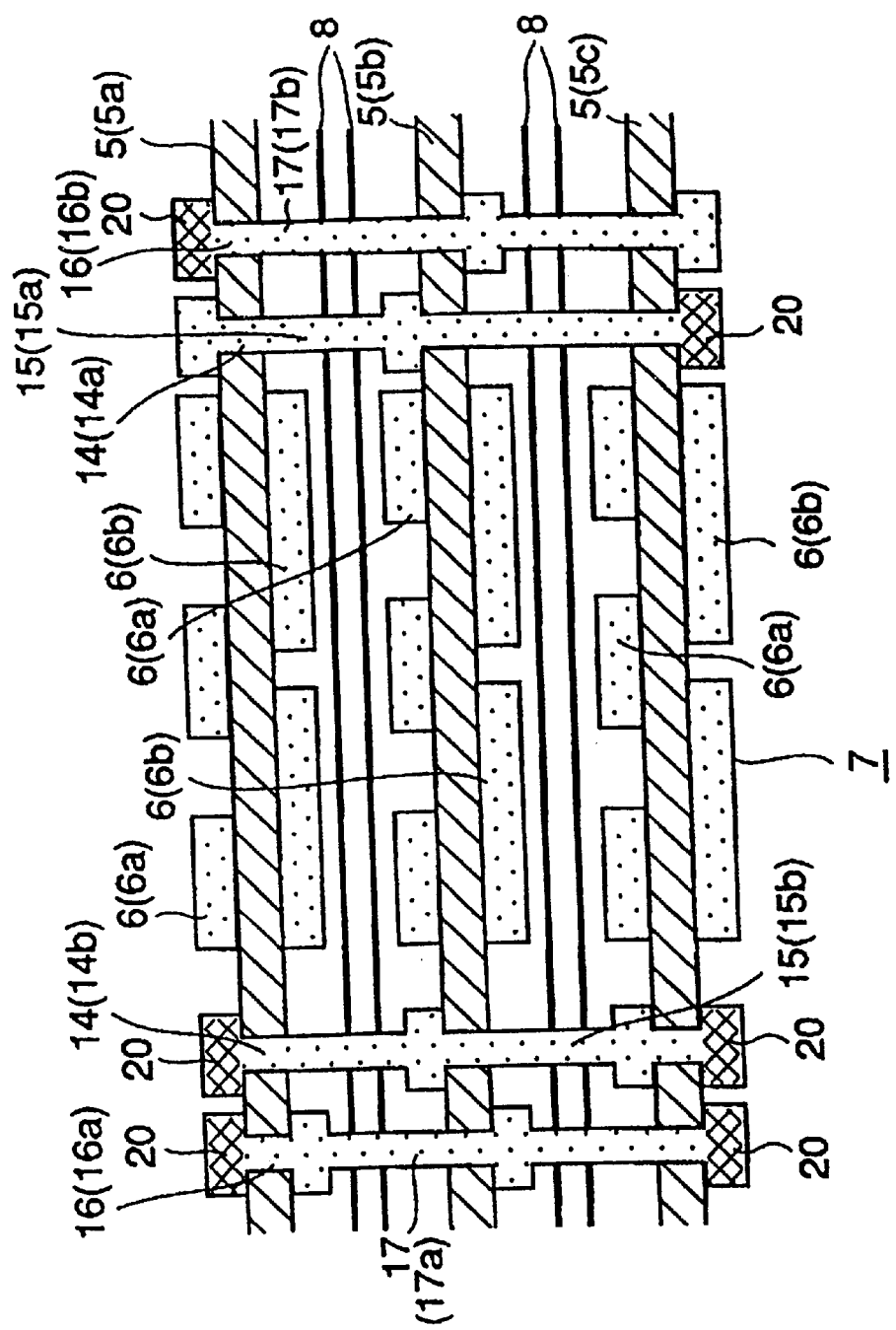
FIG. 6 is a schematic diagram illustrating an example of a conventional multilayer coil pattern structure.

More specifically, when the primary and secondary coils are formed of coil patterns 6 in, for example, six layers as shown in FIGS. 2 and 6, although the through-holes 14a, 14b, 16a, and 16b, the connection conductors 15a, 15b, 17a, and 17b, and the through-hole lands 20 are needed to be formed in four different areas in the case of the conventional sandwich structure shown in FIG. 6, the though-hole 14, the connection conductor 15, and the through-hole land 20 are needed to be formed only in one area in the structure according to the present embodiment, as shown in FIG. 2.

As described earlier, the through-hole, the conduction conductor, and the through-hole land should be formed such that they do not hinder the coil patterns 6 from being formed. Therefore, the sheet substrates should have a special area where they are formed. Therefore, as the numbers of through-holes, connection conductors, and through-hole lands increase, the total area where they are formed increases and thus total size of the multilayer circuit board 4 increases. In the present embodiment, because the numbers of through-holes, connection conductors, and through-hole lands are minimized, a reduction in the size of the multilayer circuit board 4 can be achieved.

As described above, the novel structure according to the present embodiment allows a reduction in the size of the multilayer circuit board 4 and thus a reduction in the size of the isolated converter.

Furthermore, in the present embodiment, the novel multilayer structure in which the coil patterns 6 are disposed allows reductions in the numbers of through-holes, connection conductors, and through-hole lands. This allows a reduction in the number of production steps needed to produce the multilayer circuit board 4 by disposing the sheet substrates 5 having the coil patterns 6 formed thereon into the multilayer structure. Thus, it becomes possible to reduce the time and the cost needed to produce the multilayer circuit board 4.

Furthermore, in the multilayer sheet transformer 1 according to the present embodiment, because the coil pattern 6 formed on the outer surface of the top layer and the coil pattern 6 formed on the outer surface of the bottom layer are both for the same primary coil, it becomes possible to avoid the problem that the coil pattern 6a for the primary coil and the coil pattern 6b for the secondary coil are electrically connected to each other via the core member 11.

Note that the present invention is not limited to the specific embodiment described above, but the present invention can be embodied in various fashions. For example, although in the above embodiment the coil patterns 6 formed on the outer surfaces of the top and bottom layers of the multilayer sheet transformer 1 are both for the primary coil, the coil patterns 6 formed on the outer surfaces of the top and bottom layers of the multilayer sheet transformer 1 may both be for the secondary coil.

In the case where the coil patterns 6 formed on the outer surfaces of the top and bottom layers of the multilayer sheet transformer 1 are both for the secondary coil, the multilayer sheet transformer 1 can be regarded as a part of the secondary-side circuit 3. In this case, unlike the above embodiment, the multilayer sheet transformer 1 is disposed near the secondary-side circuit 3, and an isolation gap is formed between the multilayer sheet transformer 1 and the primary-side circuit 2 to prevent an electrical breakdown between the primary and secondary sides. Also in this case, similar great advantages to those obtained in the above-described embodiment can be obtained.

Although in the above embodiment, the coil pattern 6 formed on one surface of each sheet substrate 5 is for the same coil as that formed on the opposite surface, the manner of forming the coil patterns 6 is not limited to such a manner as long as the coil pattern 6 formed on the outer surface of the top layer and the coil pattern 6 formed on the outer surface of the bottom layer of the multilayer sheet transformer 1 are for the same coil on either the primary or secondary side.

Furthermore, although in the multilayer sheet transformer 1 according to the above embodiment, an E-shaped core member is employed, the shape of the core member is not limited to the E shape, but a core member having a different shape may also be employed. The core combining member 13 should have a structure suitable for combining the core members, depending upon the shape of the core members. More specifically, when core members having a shape other than the E shape are employed, the core combining member 13 should have a shape suitable for combining the core members.

Figure 3:
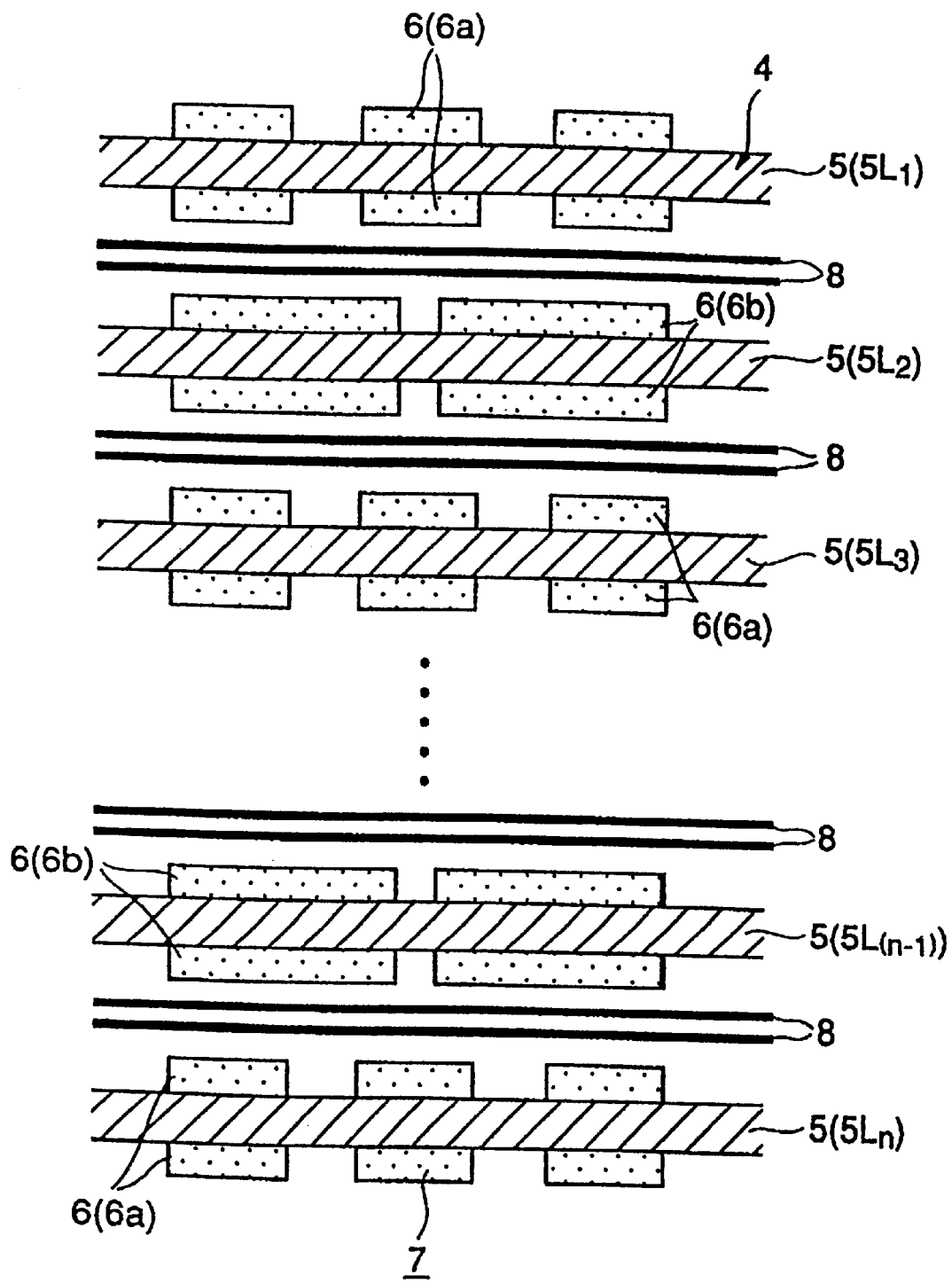
FIG. 3 is a schematic diagram illustrating coil patterns of a multilayer sheet transformer, formed in a multilayer structure according to another embodiment of the present invention.
Figure 4:
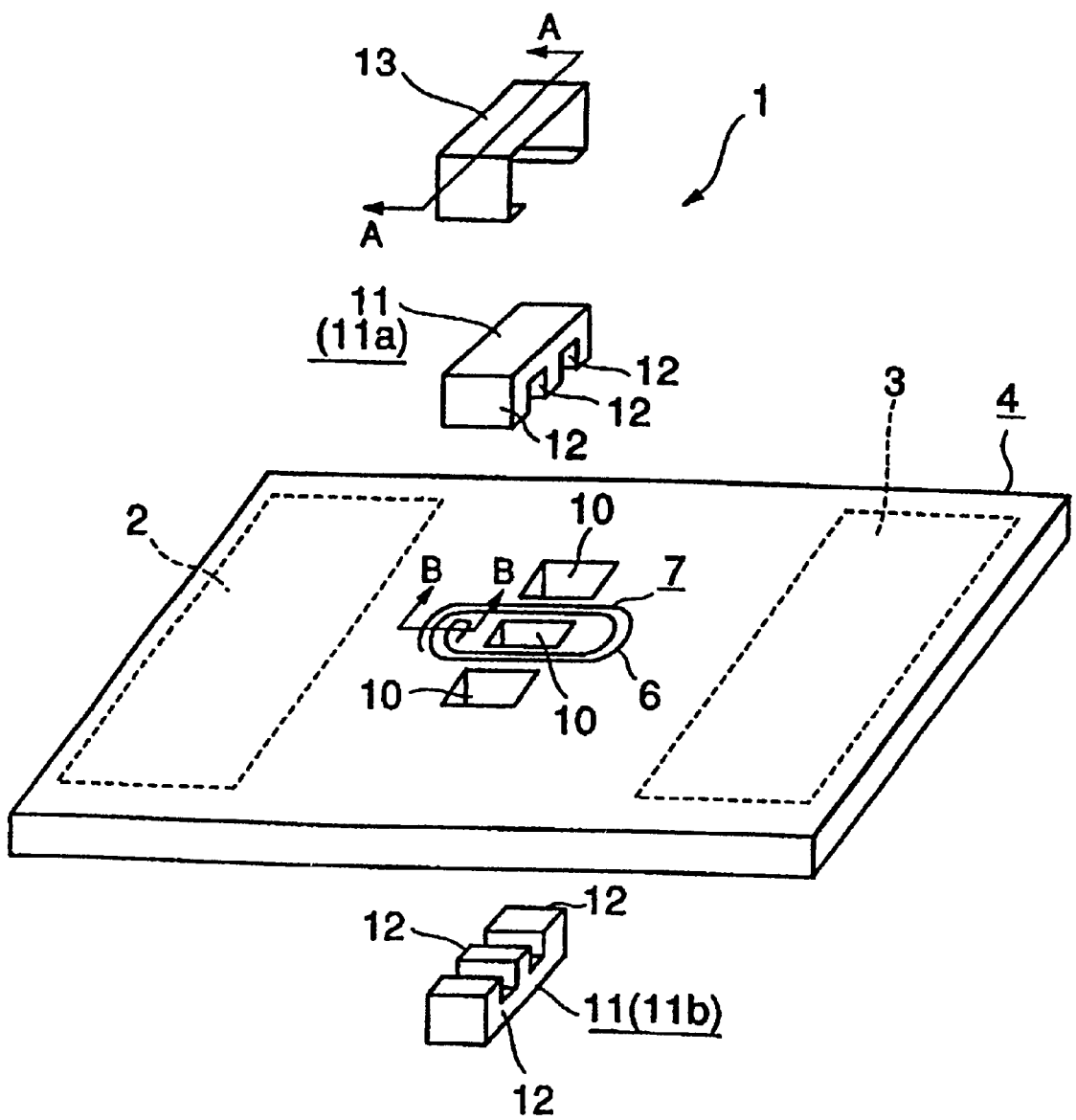
FIG. 4 is an exploded view illustrating an example of the structure of a multilayer sheet transformer.
Figure 5:
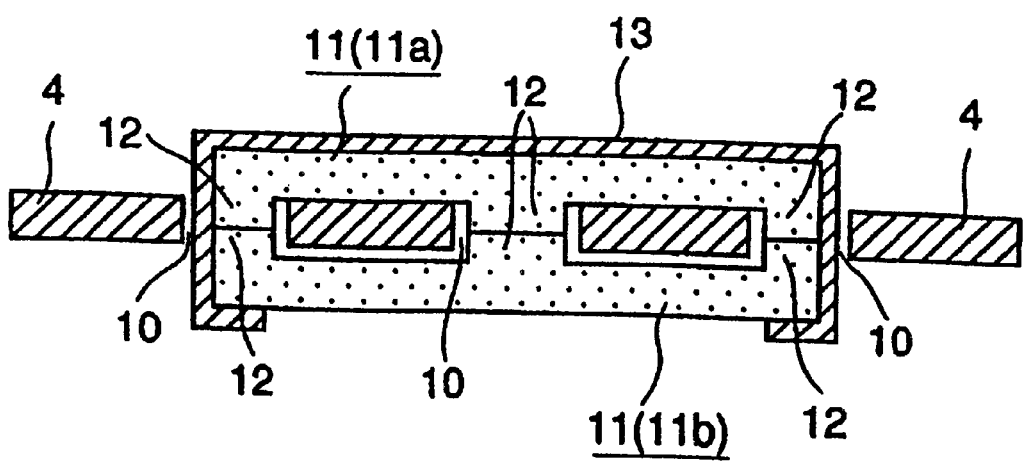
FIG. 5 is a cross-sectional view of the multilayer sheet transformer shown in FIG. 4, taken along line A—A.

Furthermore, although the coil patterns 6 are formed in six layers in the above embodiment, the number of layers of coil patterns 6 may be selected arbitrarily, as long as there are a plurality of layers. For example, in the case in which coil patterns 6 are formed in a plurality of layers as shown in FIG. 3, the coil patterns may be formed such that a coil pattern 6 formed on one surface of each sheet substrate 5 and a coil pattern 6 formed on the opposite surface of that sheet substrate 5 are for the same coil on either the primary or secondary side, and sheet substrates 5 on which coil patterns 6a for the primary coil and sheet substrate 5 on which coil patterns 6b for the secondary coil are alternately disposed whereby the numbers of through-holes, connection conductors, and through-hole lands are reduced and thus the size of the multilayer circuit board 4 is reduced, as in the above-described embodiment.

As described above, the present invention provides great advantages. That is, coil patterns are formed such that the coil pattern on the outer surface of the top layer and the coil pattern on the outer surface of the bottom layer are for the same coil on either the primary or secondary side. In the case where those coil patterns on the outer surfaces of the top and bottom layers are for the primary coil, the multilayer sheet transformer is regarded as a part of the primary circuit, and an isolation gap is formed between the multilayer sheet transformer and the area where the secondary-side circuit is formed. Conversely, in the case where the coil patterns on the outer surfaces of the top and bottom layers are for the secondary coil, the multilayer sheet transformer is regarded as a part of the secondary circuit, and an isolation gap for electrical isolation between the circuits on the primary and secondary sides is formed between the multilayer sheet transformer and the area where the secondary-side circuit is formed. Thus, in the present invention, in contrast to the conventional structure in which isolation gaps are needed on both primary and secondary sides of the multilayer sheet transformer, the isolation gap is needed on only one side of the multilayer sheet transformer. As a result, it is possible to reduce the size of the multilayer circuit board and thus the size of the isolated converter.

Furthermore, because the coil pattern formed on one surface of each sheet substrate and the coil pattern formed on the opposite surface thereof are for the same coil on either the primary or secondary side, and because and primary-side sheet substrates having the primary-coil patterns formed on both surfaces thereof and secondary-side sheet substrates having the secondary-coil patterns formed on both surfaces thereof are alternately disposed, it is possible to reduce the numbers of through-holes, connection conductors, and through-hole lands needed to electrically connect the coil patterns formed on different sheet substrates to each other without causing degradation in electrical or magnetic characteristics of the primary and secondary coils. The reductions in the numbers of through-holes, connection conductors, and through-hole lands allow a reduction in the total area needed to dispose through-holes, connection conductors, and through-hole lands, and thus it becomes possible to reduce the size of the multilayer circuit board.

A drastic reduction in the size of the multilayer circuit board and the size of the isolated converter can be obtained by a multiplier effect of the reduction in the size of the multilayer circuit board achieved by the elimination of one of the isolation gaps on the primary and secondary sides of the multilayer sheet transformer and the reduction in the size of the multilayer circuit board achieved by the reduction in the numbers of through-holes, connection conductors, through-hole lands.

As described above, use of the novel multilayer structure in which coil patterns are disposed according to the present invention allows reductions in the numbers of through-holes, connection conductors, through-hole lands, and thus it becomes possible to reduce the number of production steps needed to produce the multilayer circuit board. As a result, it becomes possible to reduce the time and cost needed to produce the multilayer circuit board.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. An isolated converter comprising a multilayer sheet transformer comprising a multilayer circuit board having a plurality of sheet substrates, a coil pattern forming a primary coil and a coil pattern forming a secondary coil disposed coaxially on the sheet substrates, the coil patterns comprising a coil pattern unit, and further comprising a core member for the coil pattern unit, wherein;

said multilayer circuit board has a first area where a primary-side circuit coupled to a primary coil of the multilayer sheet transformer is disposed, a second area where the multilayer sheet transformer is disposed, and a third area where a secondary-side circuit coupled to a secondary coil of the multilayer sheet transformer is disposed, said areas being located in order; and wherein coil patterns formed on outer surfaces of top and bottom sheet substrates of said multilayer sheet transformer are for the same coil, either primary coil or secondary coil, and wherein, where the coil patterns formed on the outer surfaces of the top and bottom layers are for the primary coil, the multilayer sheet transformer is regarded as a part of the primary-side circuit and an isolation gap for providing electrical isolation between the primary-side circuit and secondary-side circuit is disposed between the multilayer sheet transformer and the third area in which the secondary-side circuit is disposed, and wherein where the coil patterns formed on the outer surfaces of the top and bottom layers are for the secondary coil, the multilayer sheet transformer is regarded as a part of the secondary-side circuit and an isolation gap for providing an electrical isolation between the primary-side circuit and secondary-side circuit is disposed between the multilayer sheet transformer and the first area in which the primary-side circuit is disposed.

2. The isolated converter of claim 1, wherein coil patterns are formed on both surfaces of each sheet substrate such that a coil pattern formed on one surface of each sheet substrate and a coil pattern formed on an opposite surface of that sheet substrate are for the same coil, either the primary coil or secondary coil, and wherein sheet substrates are disposed into a multilayer structure such that a primary-side sheet substrate on both surfaces of which coil patterns for the primary coil are disposed and a secondary-side sheet substrate on both surfaces of which coil patterns for the secondary coil are disposed and arranged alternately.

3. An isolated converter comprising a multi-layer sheet transformer comprising a multi-layer circuit board having a plurality of sheet substrates, a coil pattern forming a primary coil and a coil pattern forming a secondary coil disposed on the sheet substrates, the coil patterns comprising a coil pattern unit and further comprising a core member for the coil pattern unit, wherein, the multi-layer circuit board has a first area where a primary side circuit coupled to the primary coil of the multi-layer sheet transformer is disposed, a second area where the multi-layer sheet transformer is disposed, and a third area where a secondary side circuit coupled to the secondary coil of the multi-layer sheet transformer is disposed, the areas being located in order;

the sheet substrates each having top and bottom surfaces, the top and bottom surfaces of each substrate having a coil pattern for the same coil, either primary coil or secondary coil, and further wherein an isolation gap between the second area where the multi-layer sheet transformer is disposed and at least one of the first and third areas where the primary side circuit, and the secondary side circuit respectively, are disposed, is provided, the isolation gap being provided such that where the coil pattern formed on outer facing surfaces of outer most ones of the substrates are for the primary coil, the isolation gap is disposed between the second area where the multi-layer sheet transformer is disposed and the third area where the secondary side circuit is disposed, and where the outer facing surfaces of the outermost ones of the substrates of the multi-layer sheet transformer have coil patterns for the secondary coil disposed thereon, said isolation gap is provided between the second area where the multi-layer sheet transformer is disposed and the first area where the primary side circuit is disposed.

4. The isolated converter of claim 3, wherein the substrates are alternately disposed such that alternate substrates have coil patterns for respective ones of said primary coil and said secondary coil.

* * * * *